United States Patent
Kawa et al.

(10) Patent No.: US 9,817,928 B2
(45) Date of Patent: Nov. 14, 2017

(54) LATCH-UP SUPPRESSION AND SUBSTRATE NOISE COUPLING REDUCTION THROUGH A SUBSTRATE BACK-TIE FOR 3D INTEGRATED CIRCUITS

(71) Applicant: SYNOPSYS, INC., Mountain View, CA (US)

(72) Inventors: Jamil Kawa, Campbell, CA (US); Victor Moroz, Saratoga, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/875,593

(22) Filed: Oct. 5, 2015

(65) Prior Publication Data

US 2016/0034620 A1    Feb. 4, 2016

Related U.S. Application Data

(63) Continuation-in-part of application No. 13/601,394, filed on Aug. 31, 2012, now Pat. No. 9,190,346.

(51) Int. Cl.
*G06F 17/50* (2006.01)
*G06F 11/22* (2006.01)
(Continued)

(52) U.S. Cl.
CPC ...... *G06F 17/5009* (2013.01); *G06F 17/5068* (2013.01); *H01L 21/76898* (2013.01);
(Continued)

(58) Field of Classification Search
USPC ............... 438/942; 257/774, 778, E27.026, 257/E27.027, E23.172, E23.173;
(Continued)

(56) References Cited

U.S. PATENT DOCUMENTS 5,428,247 A    6/1995  Sohn et al.
5,600,578 A    2/1997  Fang et al.
(Continued)

FOREIGN PATENT DOCUMENTS

CN    102376695 A    3/2012
JP    11-289089      10/1999
(Continued)

OTHER PUBLICATIONS

KR Office Action (and English translation) dated Nov. 1, 2015 in family member Application No. 2015-7007660, 15 pages.
(Continued)

*Primary Examiner* — Nghia Doan
(74) *Attorney, Agent, or Firm* — Haynes Beffel & Wolfeld LLP

(57) ABSTRACT

Roughly described, an integrated circuit device has a conductor extending entirely through the substrate, connected on one end to the substrate topside surface and on the other end to the substrate backside surface. In various embodiments the conductor is insulated from all RDL conductors on the backside of the substrate, and/or is insulated from all conductors and device features on any below-adjacent chip in a 3D integrated circuit structure. Methods of fabrication are also described.

15 Claims, 12 Drawing Sheets

(51) Int. Cl.
*H01L 21/768* (2006.01)
*H01L 23/48* (2006.01)
*H01L 23/00* (2006.01)

(52) U.S. Cl.
CPC ............ *H01L 23/481* (2013.01); *H01L 24/05* (2013.01); *H01L 24/13* (2013.01); *H01L 2224/02372* (2013.01); *H01L 2224/0401* (2013.01); *H01L 2224/05* (2013.01); *H01L 2224/05548* (2013.01); *H01L 2224/05554* (2013.01); *H01L 2224/13024* (2013.01); *H01L 2224/16238* (2013.01); *H01L 2224/32245* (2013.01); *H01L 2224/48091* (2013.01); *H01L 2224/48247* (2013.01); *H01L 2224/48257* (2013.01); *H01L 2224/49171* (2013.01); *H01L 2224/73265* (2013.01); *H01L 2924/1305* (2013.01); *H01L 2924/13091* (2013.01); *H01L 2924/181* (2013.01)

(58) Field of Classification Search
USPC .......................................... 716/118, 126, 136
See application file for complete search history.

(56) References Cited

U.S. PATENT DOCUMENTS

| | | | |
|---|---|---|---|
| 5,606,518 A | 2/1997 | Fang et al. | |
| 6,420,231 B1 | 7/2002 | Harari et al. | |
| 6,593,176 B2 | 7/2003 | Dennison | |
| 6,599,781 B1 | 7/2003 | Li | |
| 6,706,571 B1 | 3/2004 | Yu et al. | |
| 6,812,508 B2 | 11/2004 | Fukumi | |
| 6,831,292 B2 | 12/2004 | Currie et al. | |
| 6,881,632 B2 | 4/2005 | Fitzgerald et al. | |
| 6,897,125 B2 * | 5/2005 | Morrow ............ H01L 21/76898 257/E21.597 | |
| 7,190,050 B2 | 3/2007 | King et al. | |
| 7,224,019 B2 | 5/2007 | Hieda et al. | |
| 7,262,109 B2 | 8/2007 | Lin et al. | |
| 7,266,787 B2 | 9/2007 | Hughes et al. | |
| 7,291,519 B2 | 11/2007 | Bhattacharyya | |
| 7,307,273 B2 | 12/2007 | Currie | |
| 7,337,420 B2 | 2/2008 | Chidambarrao et al. | |
| 7,358,142 B2 | 4/2008 | Kang et al. | |
| 7,437,260 B2 | 10/2008 | Ausserlechner et al. | |
| 7,440,861 B2 | 10/2008 | Ausserlechner et al. | |
| 7,484,198 B2 | 1/2009 | Lin et al. | |
| 7,504,678 B2 | 3/2009 | Chau et al. | |
| 7,528,465 B2 | 5/2009 | King et al. | |
| 7,542,891 B2 | 6/2009 | Lin et al. | |
| 7,691,748 B2 | 4/2010 | Han | |
| 7,701,057 B1 | 4/2010 | Rahman et al. | |
| 7,714,397 B2 | 5/2010 | Hareland et al. | |
| 7,921,401 B2 | 4/2011 | Ito et al. | |
| 7,956,442 B2 | 6/2011 | Hsu et al. | |
| 7,960,232 B2 | 6/2011 | King et al. | |
| 8,086,990 B2 | 12/2011 | Lin et al. | |
| 8,222,680 B2 | 7/2012 | Lin et al. | |
| 8,604,518 B2 | 12/2013 | Bhuwalka et al. | |
| 8,866,275 B2 | 10/2014 | Camacho et al. | |
| 2002/0011612 A1 | 1/2002 | Hieda | |
| 2003/0173588 A1 | 9/2003 | Bianchi | |
| 2004/0044511 A1 | 3/2004 | Sekido et al. | |
| 2004/0059559 A1 | 3/2004 | Shimizu et al. | |
| 2004/0075122 A1 | 4/2004 | Lin et al. | |
| 2004/0075149 A1 | 4/2004 | Fitzgerald et al. | |
| 2004/0099925 A1 | 5/2004 | Poveda | |
| 2004/0108559 A1 | 6/2004 | Sugii et al. | |
| 2004/0153986 A1 | 8/2004 | Sahara et al. | |
| 2004/0217448 A1 | 11/2004 | Kumagai et al. | |
| 2005/0017304 A1 | 1/2005 | Matsushita et al. | |
| 2005/0023569 A1 | 2/2005 | Yang | |
| 2005/0040460 A1 | 2/2005 | Chidambarrao et al. | |
| 2005/0056892 A1 | 3/2005 | Seliskar | |
| 2005/0073005 A1 | 4/2005 | Nowak et al. | |
| 2005/0077511 A1 | 4/2005 | Fitzergald | |
| 2005/0093059 A1 | 5/2005 | Belyansky et al. | |
| 2005/0104057 A1 | 5/2005 | Shaheed et al. | |
| 2005/0110039 A1 | 5/2005 | Chi et al. | |
| 2005/0112822 A1 | 5/2005 | Litwin | |
| 2005/0121727 A1 | 6/2005 | Ishitsuka et al. | |
| 2005/0139929 A1 | 6/2005 | Rost | |
| 2005/0158931 A1 | 7/2005 | Chen et al. | |
| 2005/0176204 A1 | 8/2005 | Langdo et al. | |
| 2005/0184345 A1 | 8/2005 | Lin et al. | |
| 2005/0202604 A1 | 9/2005 | Cheng et al. | |
| 2005/0224800 A1 | 10/2005 | Lindert et al. | |
| 2005/0224875 A1 | 10/2005 | Anderson et al. | |
| 2005/0224890 A1 | 10/2005 | Bernstein et al. | |
| 2005/0239254 A1 | 10/2005 | Chi et al. | |
| 2005/0247926 A1 | 11/2005 | Sun et al. | |
| 2005/0280121 A1 | 12/2005 | Doris et al. | |
| 2005/0285186 A1 | 12/2005 | Fujiwara | |
| 2006/0003510 A1 | 1/2006 | Kammler et al. | |
| 2006/0019458 A1 | 1/2006 | Chidambarrao et al. | |
| 2006/0043529 A1 | 3/2006 | Chidambarrao et al. | |
| 2006/0091475 A1 | 5/2006 | Fujii et al. | |
| 2006/0097290 A1 | 5/2006 | Hietanen | |
| 2006/0113603 A1 | 6/2006 | Currie | |
| 2006/0142987 A1 | 6/2006 | Ishizu et al. | |
| 2006/0157687 A1 | 7/2006 | Doyle et al. | |
| 2006/0186478 A1 | 8/2006 | Hughes et al. | |
| 2006/0190893 A1 | 8/2006 | Morton | |
| 2006/0228863 A1 | 10/2006 | Zhang et al. | |
| 2006/0240650 A1 | 10/2006 | Orlowski et al. | |
| 2006/0267130 A1 | 11/2006 | Rao | |
| 2007/0026599 A1 | 2/2007 | Peidous et al. | |
| 2007/0028195 A1 | 2/2007 | Chidambarrao et al. | |
| 2007/0096170 A1 | 5/2007 | Chidambarrao et al. | |
| 2007/0096206 A1 | 5/2007 | Chidambarrao | |
| 2007/0108531 A1 | 5/2007 | Chidambarrao | |
| 2007/0235763 A1 | 10/2007 | Doyle et al. | |
| 2007/0292996 A1 | 12/2007 | Abadeer et al. | |
| 2008/0127005 A1 | 5/2008 | Lin et al. | |
| 2008/0195983 A1 | 8/2008 | Chidambarrao et al. | |
| 2009/0057777 A1 | 3/2009 | Fujii et al. | |
| 2009/0095987 A1 | 4/2009 | Rost | |
| 2009/0160050 A1 | 6/2009 | Miyakawa et al. | |
| 2009/0217217 A1 | 8/2009 | Lin et al. | |
| 2010/0225002 A1 | 9/2010 | Law et al. | |
| 2010/0244179 A1 | 9/2010 | Voldman | |
| 2011/0024890 A1 | 2/2011 | Yang et al. | |
| 2011/0042576 A1 | 2/2011 | Wilson et al. | |
| 2011/0084358 A1 | 4/2011 | Kim et al. | |
| 2011/0133339 A1 | 6/2011 | Wang | |
| 2011/0163369 A1 | 7/2011 | Xiao et al. | |
| 2011/0195546 A1 | 8/2011 | Yang | |
| 2011/0304010 A1 | 12/2011 | Jiang et al. | |
| 2011/0314437 A1 | 12/2011 | McIlrath | |
| 2012/0153437 A1 | 6/2012 | Chen et al. | |
| 2013/0102116 A1 | 4/2013 | Xiao et al. | |
| 2013/0134522 A1 | 5/2013 | Bhuwalka | |
| 2013/0285257 A1 * | 10/2013 | Lee .......... H01L 24/03 257/774 |
| 2014/0049293 A1 | 2/2014 | Mallikarjunaswamy | |
| 2014/0061936 A1 | 3/2014 | Moroz et al. | |

FOREIGN PATENT DOCUMENTS

| | | |
|---|---|---|
| KR | 10-1031798 B1 | 4/2011 |
| KR | 20110039183 A | 4/2011 |
| KR | 20110042393 A | 4/2011 |
| TW | 201036137 A | 10/2010 |
| WO | 2007014300 A2 | 2/2007 |

OTHER PUBLICATIONS

Brigham Young University, Crystal Planes in Semiconductors, 2010, http://cleanroom.byu.edu/EW.sub.--orientation.phtml, pp. 1-2.

(56) References Cited

OTHER PUBLICATIONS

Choi et al., "A spacer patterning technology for nanoscale CMOS," IEEE Transactions on Electron Devices, vol. 49, No. 3, pp. 436-441, Mar. 2002.
Nouri et al., "A Systematic Study of Trade-offs in Engineering a Locally Strained pMOSFET", Proc. IEDM, pp. 1055-1058, 2004.
Eneman et al, "Layout Impact on the Performance of a Locally Strained PMOSFET", 2005 Symposium on VLSI Technology Digest of Technical Papers, pp. 22-23, 2005.
Gildenblat, G., et al., "PSP Model" Department of Electrical Engineering, The Pennsylvania State University and Philips Research, (Aug. 2005) 82 pages.
Hisamoto D., et al., "A Folded-channel MOSFET for Deep sub-tenth Micron Era", IEEE International Electron Device Meeting Technical Digest, Dec. 6-9, 1998, pp. 1032-1034.
Kanda, Y., "A Graphical Representation of the Piezoresistance Coefficients in Silicon", IEEE Transactions on Electron Devices, vol. Ed-29, No. 1, Jan. 1982, pp. 64-70.
Lindert N. et al., "Sub-60-nm Quasi-Planar FinFETs Fabricated Using a Simplified Process," IEEE Electron Device Letters, Oct. 22, 2001, pp. 487-489.
Moroz, V. et al., "Analyzing strained-silicon options for stress-engineering transistors", Solid State Technology, Jul. 2004, 3 pages.
Moroz, V., et al., "Options at the 45 nm node include engineered substrates", Solid State Technology, Jul. 2005, 4 pages.
PCT/US2013/057337—International Preliminary Examination Report dated Mar. 3, 2015, 1 page.
PCT/US2013/057337—International Search Report and Written Opinion dated Dec. 27, 2013, 15 pages.
PCT/US2013/075814—International Search Report and Written Opinioin dated Apr. 23, 2014, 15 pages.
Quirk et al. Semiconductor Manufacturing Technology, 2001, Prentice Hall, 67 pages.
Bianchi et al., "Accurate Modeling of Trench Isolation Induced Mechanical Stress Effects on MOSFET Electrical Performance," IEEE IEDM Tech. Digest, pp. 117-120 (Dec. 2002).
Radosavljevic, M., et al., "Electrostatics Improvement in 3-D Trigate Over Ultra-Thin Body Planar InGaAs Quantum Well Field EffectTransistors with High-K Gate Dielectric and Scaled Gate-to-Drain/Gate-to-Source Separation," 2011 IEEE International Electron Devices Meeting (IEDM), #278, 3 pgs.
Radosavljevic, M., et al., "Non-Planar, Multi-Gate InGaAs Quantum Well Field Effect Transistors with High-K Gate Dielectric and Ultra-Scaled Gate-to-Drain/Gate-to-Source Separation for Low Power Logic Applications," 2010 IEEE International ElectronDevices Meeting (IEDM), pp. 126-129.
Smith, C.S., "Piezoresistance Effect in Germanium and Silicon", Physical Review, vol. 94, No. 1, Apr. 1, 1954, pp. 42-49.
Smith, L., et al., "Exploring the Limits of Stress-Enhanced Hole Mobility", IEEE Electron Device Letters, vol. 26, No. 9, Sep. 2005, pp. 652-654.
Thompson, S.E., et al., "A 90-nm Logic Technology Featuring Strained-Silicon", IEEE Transactions on Electron Devices, 2004, pp. 1-8.
TW 102131051—Office Action and Search Report dated Mar. 24, 2015, 41 pages.
U.S. Appl. No. 13/601,394—Final Office Action dated Jan. 15, 2015, 25 pages.
U.S. Appl. No. 13/601,394—Notice of Allowance dated Jun. 30, 2015, 9 pages.
U.S. Appl. No. 13/601,394—Office Action dated Aug. 18, 2014, 11 pages.
U.S. Appl. No. 13/601,394—Office Action dated Mar. 21, 2014, 14 pages.
U.S. Appl. No. 13/601,394—Response to Final Office Action dated Jan. 15, 2015, filed Apr. 15, 2015, 13 pages.
U.S. Appl. No. 13/601,394—Response to Final Office Action dated Jan. 15, 2015, filed May 15, 2015, 15 pages.
U.S. Appl. No. 13/601,394—Response to Final Office Action dated Jan. 15, 2015, filed Jun. 19, 2015, 11 pages.
U.S. Appl. No. 13/601,394—Response to Office Action dated Aug. 18, 2014, filed Nov. 13, 2014, 14 pages.
U.S. Appl. No. 13/601,394—Response to Office Action dated Mar. 21, 2014, filed Jun. 18, 2014, 12 pages.
U.S. Appl. No. 14/072,702—Notice of Allowance dated Jun. 24, 2015, 12 pages.
U.S. Appl. No. 14/072,702—Office Action dated Mar. 11, 2015, 21 pages.
U.S. Appl. No. 14/072,702—Office Action dated Oct. 27, 2014, 15 pages.
U.S. Appl. No. 14/072,702—Response to Office Action dated Mar. 11, 2015, filed Jun. 11, 2015, 7 pages.
U.S. Appl. No. 14/072,702—Response to Office Action dated Oct. 27, 2014, filed Dec. 29, 2014, 8 pages.
U.S. Appl. No. 14/072,702—Supplemental Response to Office Action dated Mar. 11, 2015, filed Jun. 15, 2015, 5 pages.
U.S. Appl. No. 14/072,707—Notice of Allowance dated Jun. 25, 2015, 12 pages.
U.S. Appl. No. 14/072,707—Office Action dated Mar. 12, 2015, 21 pages.
U.S. Appl. No. 14/072,707—Office Action dated Oct. 24, 2014, 15 pages.
U.S. Appl. No. 14/072,707—Response to Office Action dated Mar. 12, 2015, filed Jun. 11, 2015, 8 pages.
U.S. Appl. No. 14/072,707—Response to Office Action dated Oct. 24, 2014, filed Dec. 26, 2014, 9 pages.
Wolf S., "Latchup in CMOS," Ch. 6.4, Silicon Processing for the VLSI Era, vol. 2: Process Integration, Lattice Press, Sunset Beach, CA, 1990, pp. 400-419.
Xuemei (Jane) Xi, et al., "BSIM4.3.0 Model, Enhancements and Improvements Relative to BSIM4.2.1", University of California at Berkeley (2003), pp. 1-22, available at http://www-devices.eecs.berkeley.edu/~bsim3/BSIM4/BSIM430/doc/BSIM 430_Enhancement.pdf.
DE Office Action (and English Translation) dated May 3, 2016 in family member Application No. 11 2013 004 261.4, 11 pages.
TW 102131051—Second Office Action dated Oct. 30, 2015, 50 pages.
TW 102131051—Response to Second Office Action dated Oct. 30, 2015 filed Dec. 30, 2015, 10 pages.
KR 20157007660—Response to Office Action dated Nov. 1, 2015, 83 pages.
KR 20157007660—Notice of Allowance dated May 23, 2016, 3 pages.
TW 102131051—Response to First Office Acton and Search Report dated Mar. 24, 2015 filed Jun. 24, 2015, 23 pages.
TW 102131051—Third Office Acton dated Aug. 10, 2016, 18 pages.
U.S. Appl. No. 13/601,394—Amendment Afer Allowance filed Sep. 23, 2015, 10 pages.
TW 102131051—Response to Third Office Action dated Aug. 10, 2016 filed Nov. 10, 2016, 13 pages.
DE 11 2013 004 261.4—Response to First Office Action dated May 3, 2016 filed on Oct. 27, 2016, 30 pages.
TW 102131051—Notice of Allowance dated Nov. 24, 2016, 2 pages.
U.S. Appl. No. 13/601,394—Amendment After Allowance filed Sep. 23, 2015, 10 pages.
U.S. Appl. No. 13/601,394—Notice of Allowance dated Oct. 20, 2015, 4 pages.
U.S. Appl. No. 14/072,707—Amendment After Allowance filed Sep. 23, 2015, 6 pages.
U.S. Appl. No. 14/072,702—Amendment After Allowance dated Sep. 23, 2015, 5 pages.
CN 201380053490.5—First Office Action dated Nov. 28, 2016, 11 pages.
U.S. Appl. No. 13/601,394—Preliminary Amendment dated Oct. 24, 2013, 8 pages.
U.S. Appl. No. 13/601,394—Response to Restriction Requirement dated Jul. 23, 2013, filed Jan. 21, 2014, 11 pages.
U.S. Appl. No. 13/601,394—Advisory Action dated May 1, 2015, 2 pages.

(56) References Cited

OTHER PUBLICATIONS

CN 201380053490.5—Response to First Office Action dated Nov. 28, 2016 filed Apr. 13, 2017, 15 pages.
TW 105136666—First Office Action dated Jul. 4, 2017, 16 pages.
CN 201380053490.5—Second Office Action dated Jul. 13, 2017, 22 pages.

* cited by examiner

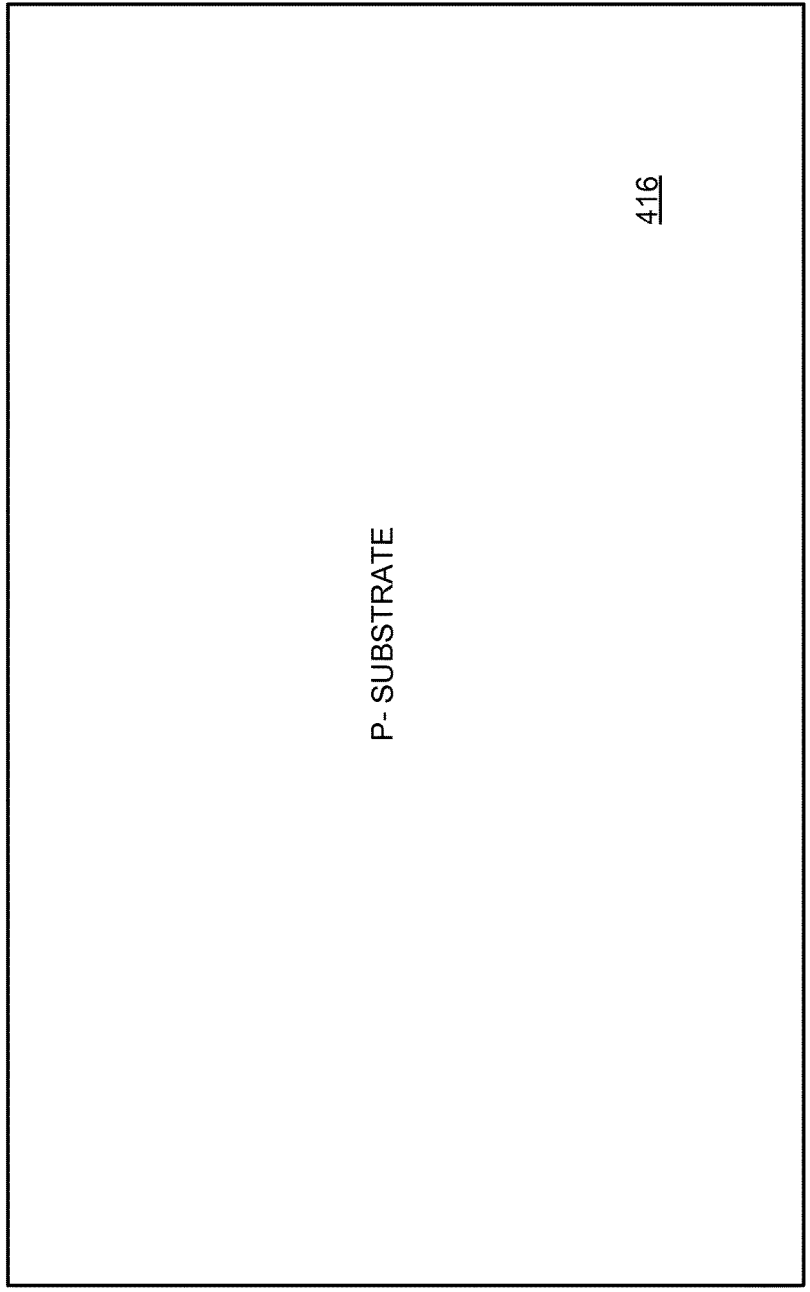

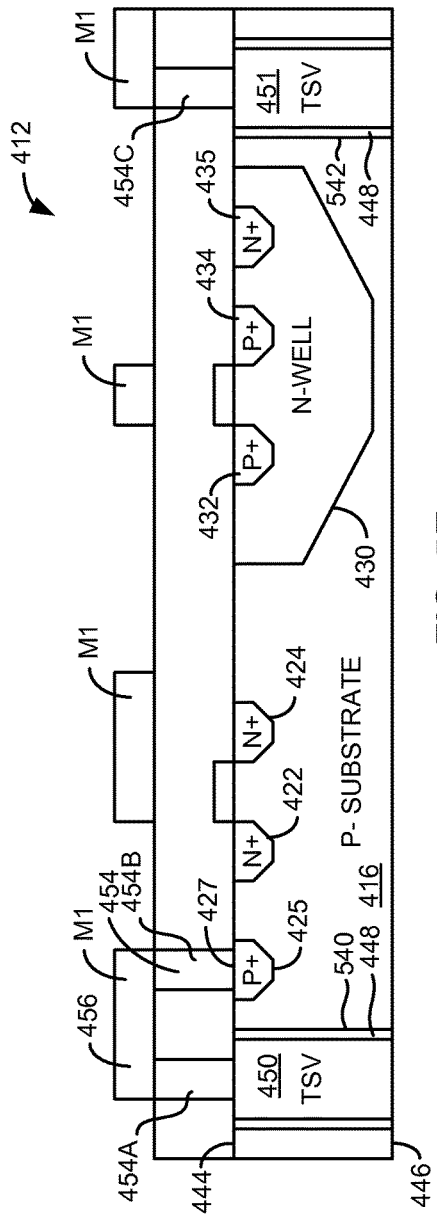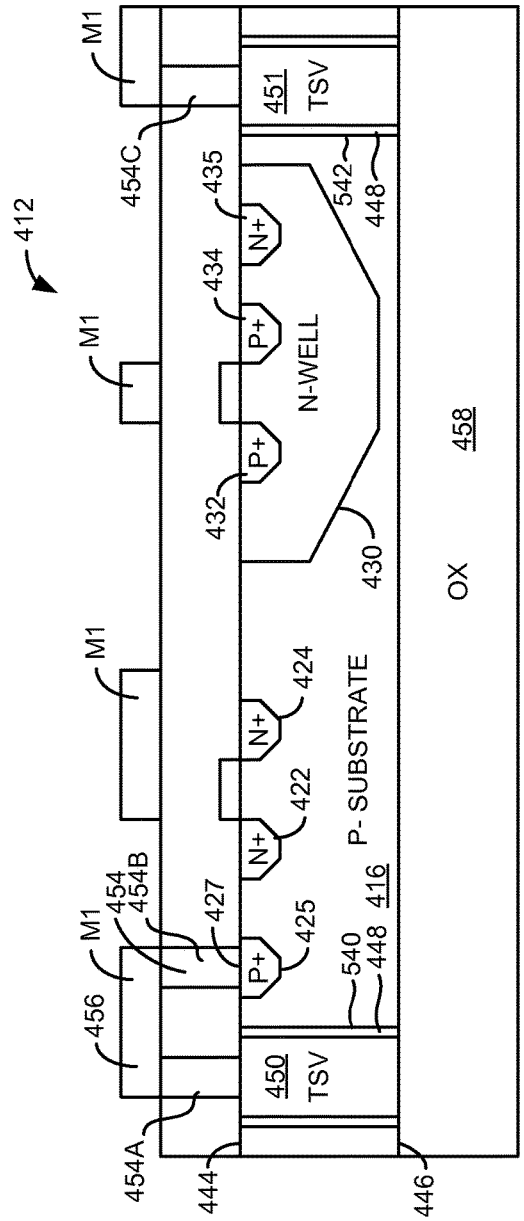
FIG. 5E
FIG. 5F

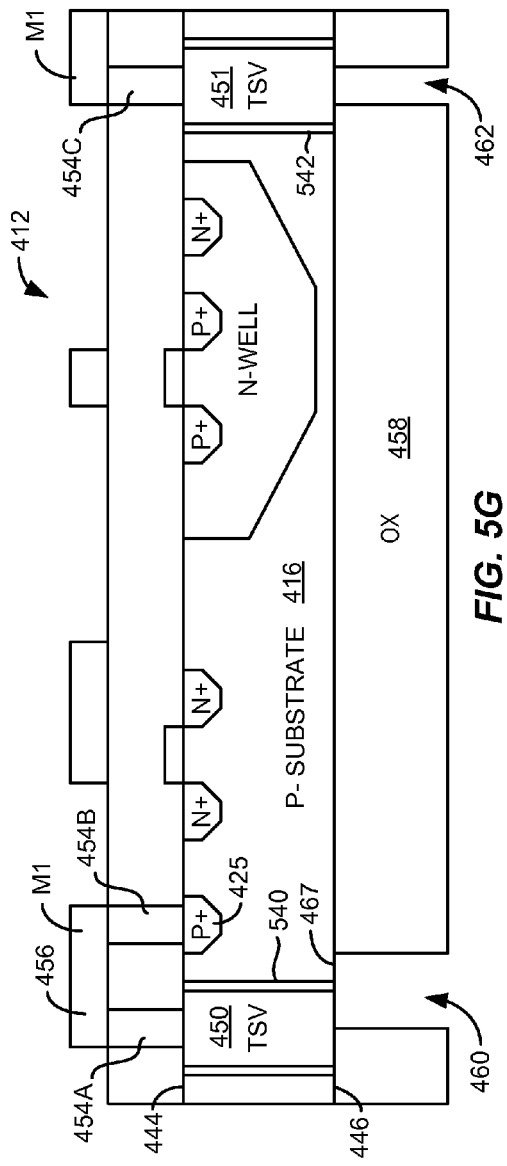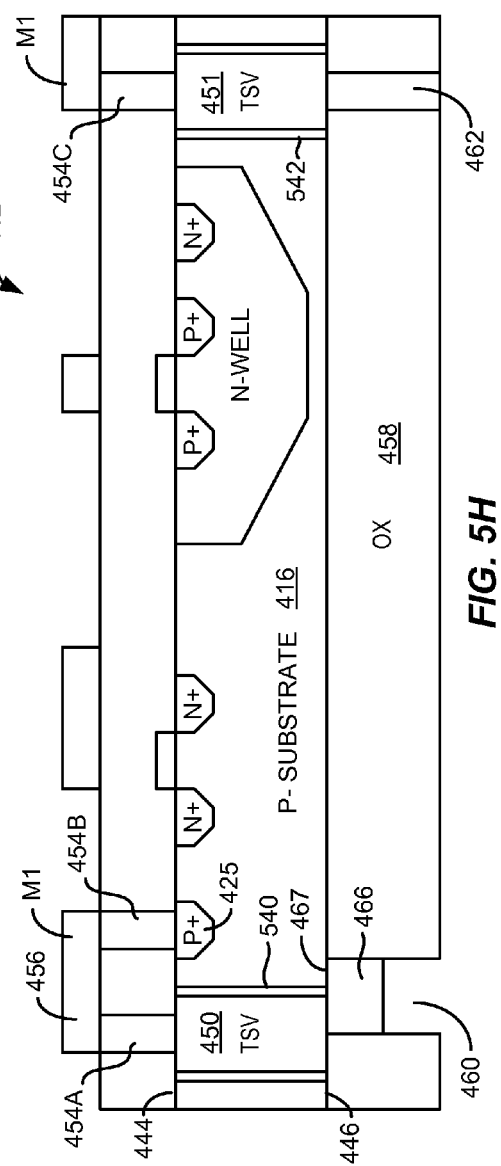

LATCH-UP SUPPRESSION AND SUBSTRATE NOISE COUPLING REDUCTION THROUGH A SUBSTRATE BACK-TIE FOR 3D INTEGRATED CIRCUITS

RELATED APPLICATIONS

This application is a continuation-in-part of co-pending application Ser. No. 13/601,394 filed on 31 Aug. 2012, entitled "Latch-Up Suppression And Substrate Noise Coupling Reduction Through A Substrate Back-Tie For 3d Integrated Circuits."

BACKGROUND

The invention relates to 3D integrated circuits, and more particularly to structures and methods for suppressing latch-up and noise coupling.

A typical CMOS circuit includes N- and P-type regions arranged to form planar or multi-gate MOS transistors. Regions of opposite conductivity types which are adjacent each other typically form parasitic pn junctions and bipolar transistor structures. While usually reverse-biased, conditions can occur in which these structures become forward biased. When this occurs, a positive feedback loop ensues which provides a low resistance current path from the positive supply voltage to ground, thereby interfering with proper functioning of the circuit and, in serious cases, destroying the chip through heat damage.

FIG. 1 is a schematic diagram showing a typical CMOS arrangement including a PMOS transistor 110 adjacent to an NMOS transistor 112. Such proximity is common in CMOS devices. The PMOS transistor 110 includes two heavily doped P+ diffusion regions 116 and 118 separated laterally by a channel region 120. A gate stack 122 overlies the channel region 120. The two P+ diffusion regions 116 and 118 are formed inside an N-well 124, which is itself an N-doped region formed inside a lightly doped P− substrate 114. Also formed within the N-well 124 is a heavily doped N+ diffusion 125, also called a well tie or a contact pad, for connecting the N-Well 124 to VDD.

The NMOS transistor 112 includes two heavily doped N+ type diffusion regions 126 and 128 separated laterally by a channel region 130. A gate stack 132 overlies the channel region 130. The two N+ diffusion regions 126 and 128 are formed directly in the P− substrate 114. Also formed in the substrate in close proximity to one of the N+ diffusion regions 126 and 128, is a heavily doped P+ diffusion region 135, also called a substrate tie or a contact pad, for connecting the P− substrate 114 to ground.

Other CMOS arrangements are common as well, including those that also include a lightly doped P−-well in which the NMOS transistor 112 is formed. The arrangement of FIG. 1 will be illustrative of the latch-up problem, but it will be understood that many other arrangements also suffer from the same problem.

Superimposed on the CMOS diagram of FIG. 1 is a circuit schematic illustrating the bipolar transistors that are formed by the various PN junctions formed by the CMOS arrangement. In particular, a PNP transistor Q1 is formed by one of the P+ diffusions 116 or 118 acting as the emitter E1, the N-well 124 acting as the base B1, and the P− substrate 114 acting as the collector C1. At the same time, the N-well 124 acts as the collector C2 of an NPN transistor Q2, with the P− substrate 114 acting as the base B2, and one of the N+ regions 126 or 128 acting as the emitter E2. The base B1 of the PNP transistor Q1 is connected to the collector C2 of the NPN transistor Q2, and the base of NPN transistor Q2 is connected to the collector C1 of PNP transistor Q1. The base B1 of transistor Q1 is connected to N+ diffusion 125 through the resistance Rw of the N-well 124, and the base B2 of transistor Q2 is connected to P+ diffusion 135 through the substrate resistance Rs.

FIG. 2 is schematic circuit diagram of FIG. 1 rearranged to show it vertically. It can be seen that as long as the two bipolar transistors Q1 and Q2 are not forward biased, current will not flow through the circuit. A number of conditions can trigger latch-up however, including noise, which sometimes can induce sufficient current at the base of one of the transistors for long enough to forward bias the other transistor, thereby starting a feedback loop. Several techniques have been devised for reducing or eliminating latch-up susceptibility, some of which are discussed in Wolf, Silicon Processing for the VLSI Era, Vol. II, Process Integration, pp. 400-419 (1990), incorporated herein by reference.

One common technique for reducing or eliminating latch-up susceptibility is to connect the backside of the substrate to ground. Referring to FIG. 1, if the substrate is connected to ground through an additional one or more ties such as substrate back-tie in addition to tie 135 which is also connected to ground, it can be seen that this technique provides a low resistance current path in parallel with the substrate resistance Rs, effectively short circuiting it. The base B2 of NPN transistor Q2 therefore is effectively connected to its emitter E2 and the transistor cannot conduct.

FIG. 3 (consisting of FIGS. 3A and 3B) illustrates how the short circuiting of Rs is often accomplished in a typical lead frame package. FIG. 3A is a cross-sectional view of the package showing a die 310, and FIG. 3B is an enlarged topside view of a corner 322 of the structure of FIG. 3A. As shown in FIG. 3A, the die 310 is attached on its back side using an electrically conductive die attach adhesive 312, to a metal lead frame pad 314. The lead frame also includes a number of metal leads 316 that extend out through the epoxy molded packaging material 318 for external electrical connection. Some of the leads 316, for example lead 316A, are connected to the lead frame pad 314 to ground externally of the package, and thereby connect the back side of the die 310 to ground. Others of the leads 316 are connected to various I/O and power pads (324 in FIG. 3B) on the top side of the chip. In addition, FIG. 3B also illustrates that some of the bonding pads 324, for example 324A, are connected ("down-bonded") directly to the lead frame pad 314 using corresponding bonding wires 320A. These bonding pads 324A are formed on and connect to heavily doped P+ contact pads such as 135 (FIG. 1). Since as previously mentioned the backside of the die is also connected to the lead frame pad 314 through conductive die attach material 312, it can be seen that a very low resistance conductive path is formed electrically connecting the P+ contact pads 135 to the backside of the substrate die 310, thereby short circuiting the substrate resistance Rs (FIG. 1). With Rs short circuited, it becomes much less likely that transient current flow through PNP transistor Q1 can increase the base-collector voltage on NPN transistor Q2 sufficiently to turn it on. As a result, latch-up conditions are less likely.

Recently, as integrated circuit densities have increased, manufacturers have begun developing packaging structures in which two or more dies are stacked on top of each other. Signal and power supply lines from the top surface of one chip are passed through the body of the chip to the one below using through-silicon vias (TSVs). A TSV is a conductive post that extends all the way through the chip, from the topside surface to the backside surface, where it can connect through metal bump contacts to conductors on the topside surface of the below-adjacent chip. The conductor in the TSV is typically copper or another metal such as TiW, and it is typically isolated from the substrate along its entire length by a dielectric or other barrier material. On the topside, ordinary metal interconnects connect the top ends of the TSV conductors to circuit components. The backside surface of the chip is coated with an insulator, such as an oxide, and holes are opened to expose the bottom ends of the TSV conductors. One or more layers of metal interconnects (called RDL (redistribution layer) conductors) are formed on the backside to electrically route signals and power from the bottom ends of the TSV conductors to the positions required for mating with the appropriate bump contacts on the below-adjacent chip. The bottom chip in the stack is connected to external circuitry usually by TSVs connected on the backside to a ball grid array (BGA). The overall stack of chips is sometimes referred to herein as a three-dimensional integrated circuit (3DIC).

3DIC technology poses a number of problems for known techniques for suppressing latch-up. First, because of the difficulties in fabricating very deep TSVs, chip substrates used in 3DICs typically are considerably thinned, from the backside, to a thickness of only around 50 microns. Referring to FIG. 1, it can be seen that a much thinner substrate considerably narrows the current path through the substrate to the P+ substrate contact pads 135, thereby significantly increasing the substrate resistance Rs. Moreover, down-bonding is no longer available to short circuit this current path, since the substrate backside is not connected by die attach adhesive to a below-adjacent lead frame pad. Thus Rs is not short circuited, and the potential for latch-up conditions is significantly higher. Second, in 3DIC's, it is common for TSVs to be used to carry power and signals through a particular chip, from the below-adjacent chip to the above-adjacent chip and vice-versa, without ever having to connect to the chip or chips stacked between them. This is common where, for example, some chips are designed to operate at 1 volt while the chips above and below are operating at 3.3 volts. In this case the TSV might carry a 3.3 volt signal through a 1 volt chip, which can easily induce sufficient currents by capacitive coupling to trigger latch-up in the more sensitive 1 volt chip.

Accordingly, an opportunity arises to create robust solutions to the problem of latch-up susceptibility in 3D integrated circuits. Better chip yields, and denser, and more powerful circuits, components and systems may result.

SUMMARY

Roughly described, an integrated circuit device has a conductor extending entirely through the substrate, connected on one end to the substrate topside surface and on the other end to the substrate backside surface. In various embodiments the conductor is insulated from all RDL conductors on the backside of the substrate, and/or is insulated from all conductors and device features on any below-adjacent chip in a 3D integrated circuit structure.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which:

FIG. 3 consists of FIGS. 3A and 3B.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
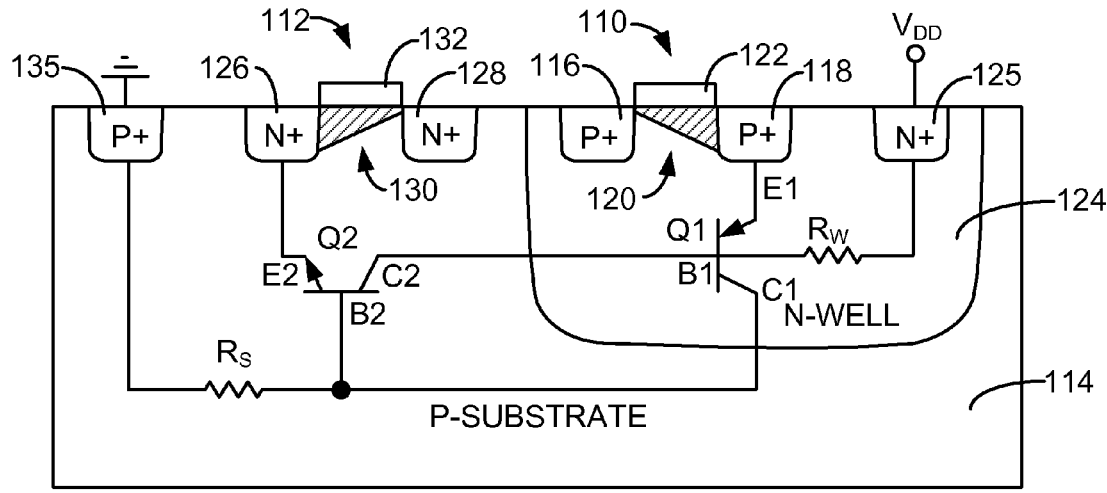
FIG. 1 is a schematic diagram showing a typical CMOS structure in cross-section. Bipolar parasitic transistor circuitry is superimposed on the cross-section.
Figure 2:
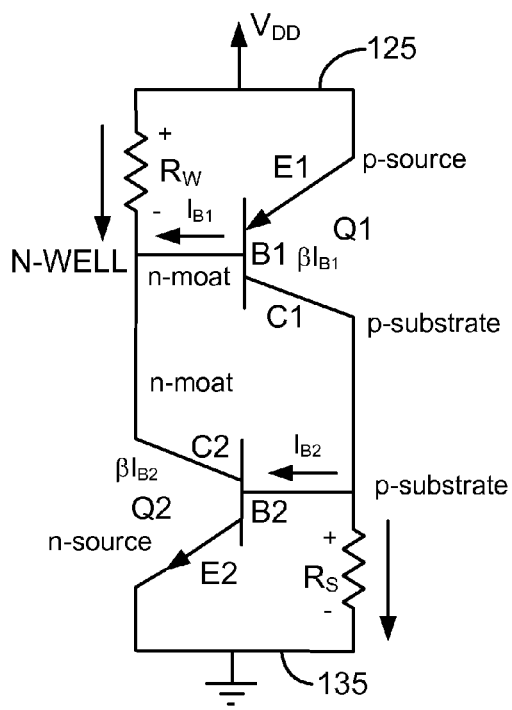
FIG. 2 is schematic circuit diagram of the bipolar circuitry of FIG. 1 rearranged to show it vertically.
Figure 3A:
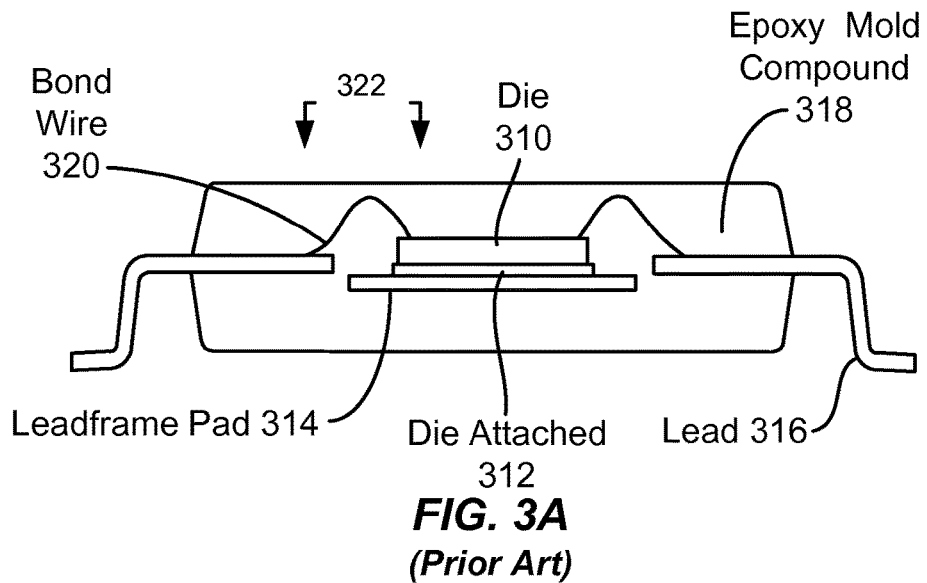
FIG. 3A a cross-sectional view of a package showing a die.
Figure 3B:
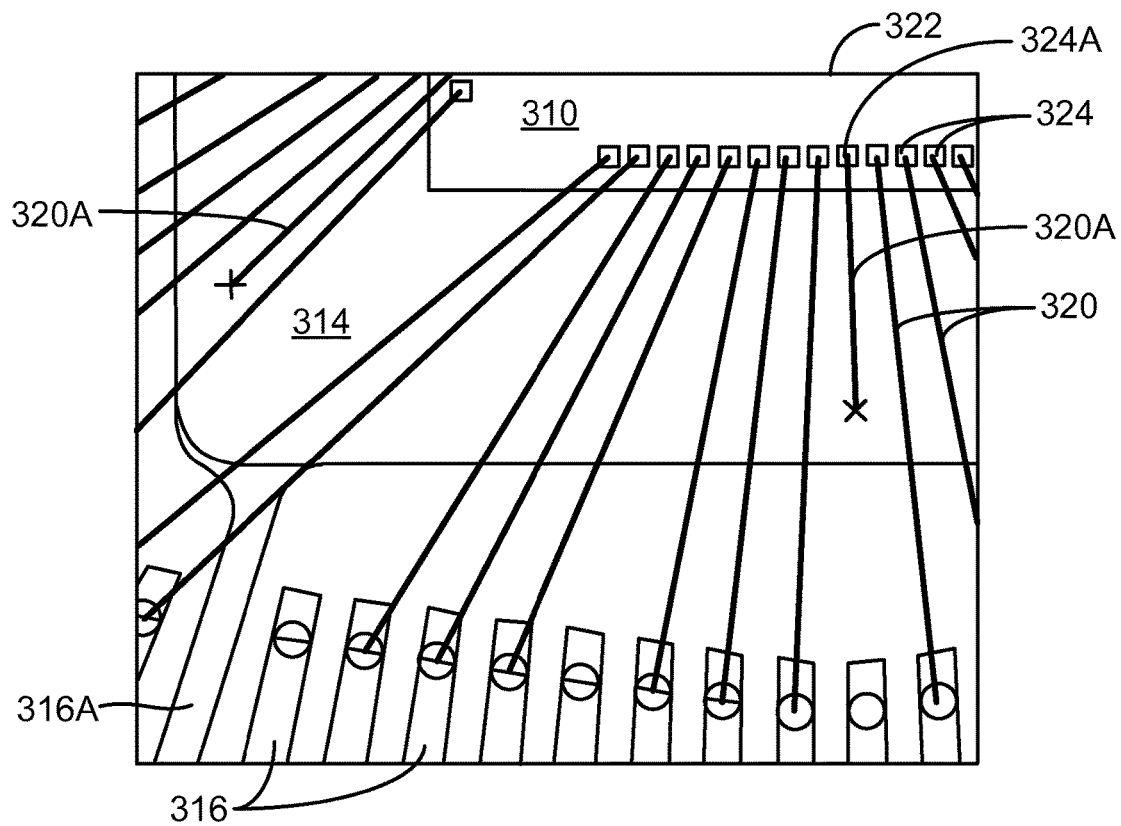
FIG. 3B is an enlarged topside view of a corner 322 of the structure of FIG. 3A.
Figure 4:
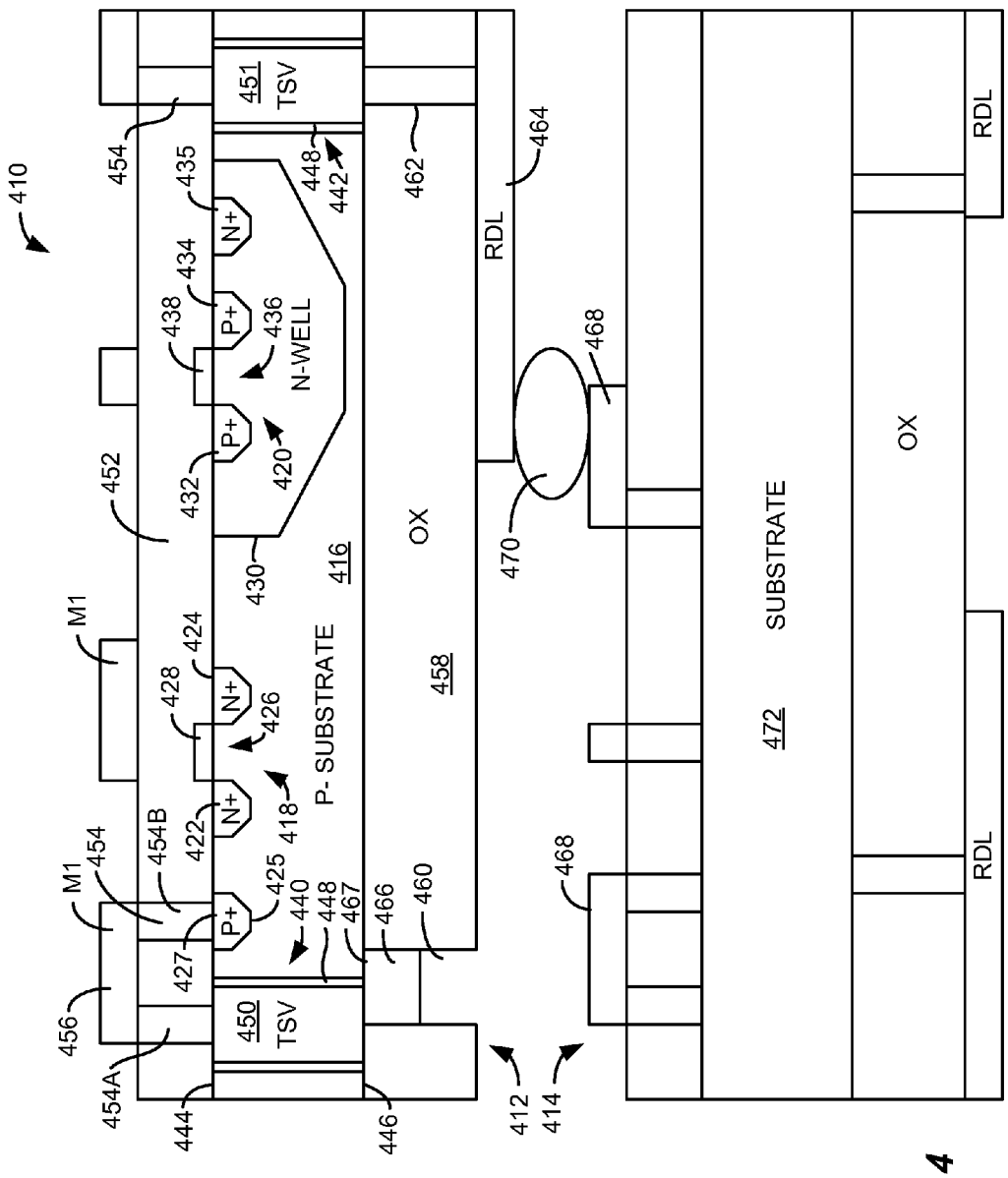
FIG. 4 is a cross-sectional view illustrating pertinent features of a 3D integrated circuit structure incorporating aspects of the invention.

FIG. 4 is a cross-sectional view illustrating pertinent features of a 3D integrated circuit structure 410 incorporating aspects of the invention. The drawing, as with all drawings herein, is not to scale. Only a small part of the structure is shown, and it will be understood that typically each chip is much larger (laterally) and includes many more features. Additionally, FIG. 4 shows only two vertically-adjacent chips of the 3D structure 410: chip 412 and below-adjacent chip 414. A typical 3D IC might include additional chips further above and/or below, all oriented parallel to each other in a fixed structure. Pertinent features of chip 412 are described herein, and only some features of chip 414 are described herein. It will be understood that chip 414 may be structured similarly to chip 412 in some embodiments, but need not be.

Chip 412 includes a lightly doped P− substrate 416 on which all features are formed. As used herein, no distinction is made between the formation of features "in" or "on" a substrate, and both terms are used interchangeably herein. The chip 412, which is only about 50 microns thick in the illustrated embodiment, includes an NMOS transistor 418 and a PMOS transistor 420. The NMOS transistor 418 includes two N+ diffusions 422 and 424 separated laterally by a channel region 426. A gate stack 428 is formed above the channel region 426. The PMOS transistor 420 is formed within an N-well diffusion 430, and includes two P+ diffusions 432 and 434 separated laterally by a channel region 436. A gate stack 438 is formed above the channel region 436. The chip also includes a heavily doped N+ contact pad 435 formed in N-well 430, as well as a heavily doped P+ contact pad 425 formed directly in the P− substrate 416.

In the illustration of FIG. 4 the chip 412 also includes two through-silicon vias (TSVs) 440 and 442. These vias extend entirely through the chip 416, from the topside surface 444 through the backside surface 446. As used herein, a "topside" surface and a "backside" surface are the two opposite major surfaces of the chip, and it will be understood that if the chip is turned upside down, the surface labeled the topside surface remains the topside surface and the surface labeled the backside surface remains the backside surface. In addition, the terms topside and backside also indicate directions relative to the wafer. That is, a layer said to be located "on the backside" of a wafer need not necessarily be disposed immediately adjacent to the backside surface, so long as it is disposed beyond the backside surface, in a direction away from the wafer body. For example, in the illustration of FIG. 4 both the oxide layer 458 and the RDL conductor 464 each can be described as being "on the backside" of the wafer, and the RDL conductor 464 also can be described as being "on the backside" of the oxide layer 458.

The TSVs 440 and 442 in FIG. 4 are filled with an electrically conductive material such as copper or TiW to form conductors 450 and 451 respectively, and lined with an insulating material such as SiO2 448 to isolate the conductors from the substrate. The topside surface 444 of the substrate 416, and above the gate stacks 428, 438, there is formed a dielectric layer 452, made for example of an oxide. Vias (holes) are formed in the dielectric layer 452. The vias are filled with a conductive material 454, such as aluminum, and first metal layer M1 conductors are formed on top. Note that whereas the illustration of FIG. 4 shows only one metal layer M1, it will be appreciated that a typical chip may also have several more metal layers formed above M1, each isolated from the below-adjacent layer by a dielectric similar to dielectric layer 452.

It can be seen in FIG. 4 that one of the M1 conductive segments is electrically connected to the topside end of the TSV conductor 451 through via 454C. Another one of the M1 conductive segments 456 electrically connect the substrate topside end of the TSV conductor 450 to the P+ contact pad 425, through respective vias 454A and 454B. In another embodiment, the connection of the substrate topside end of the TSV conductor 450 to the P+ contact pad 425 can be made in a different metal layer instead, or in some embodiments through a conductive path traversing more than one layer of metal.

On the backside surface 446 the chip 412 includes a dielectric layer 458 (such as an oxide), and on the backside of the dielectric layer 458 are RDL (redistribution layer) conductors for routing power and signals to desired lateral positions for making contact with a below-adjacent chip. One RDL conductor 464 is shown, it being understood that typically there are many more in addition. RDL 464 is connected to the backside-end of TSV conductor 451 through conductive material in a via 462 passing through the dielectric layer 458. As is typical, the conductive material in via 462 is considerably narrower than the conductor 451 in TSV 442, and at the backside surface 446 it makes electrical contact only with the conductor 451.

It can also be seen in FIG. 4 that no RDL conductor is connected to the backside end of TSV conductor 450. Instead, via 460 is offset relative to the TSV 440 such that the conductive material 466 inside it makes electrical contact with both the backside end of TSV conductor 450 and the backside surface 446 of the substrate 416 itself. Because of this connection, as well as the connection on the topside of substrate 416 through metal layer conductive segment 456, it can be seen that in the structure of FIG. 4 the P+ contact pad 425 on the topside surface 444 is connected to the backside surface 446 of the substrate 416, thereby bypassing the substrate resistance Rs with a low resistance path and effectively suppressing lockup conditions. More particularly, the TSV conductor 450 has a topside end connected to a point on the substrate 416 topside surface 444, and has a backside end connected to a point on the substrate 416 backside surface 446.

The TSV conductor 450 topside end is actually connected to an entire surface region 427 on the substrate 416 topside surface 444, but as used herein, that does not alter the fact that it is connected to at least one point. Similarly, the TSV conductor backside end is actually connected to an entire surface region 467 on the substrate 416 backside surface 446, but as used herein, that does not alter the fact that it is connected to at least one such point. Also, whereas the portion of chip 412 illustrated in FIG. 4 shows only one TSV conductor 450 that is connected in this way, it will be appreciated that preferably a chip would contain numerous such conductors, spread throughout the lateral area of the chip.

The chip 414 of FIG. 4, as mentioned, is below-adjacent to the chip 412 in the 3D IC 410. Chip 414 includes upper layer conductors 468 which are connected to circuit or device features below through vias in various dielectric layers. The upper layer conductors 468 are connected to circuitry on the above-adjacent chip 412 by bump contacts such as 470. An electrically conductive path is formed from a device feature (not shown) on chip 414 to a device feature on chip 412 by conductors passing through vias on the topside of the substrate 472 of chip 414 and routed along various metal layers, through bump contacts such as 470, along RDL conductive segments such as 464 on the backside of the above-adjacent chip 412, through vias such as 462 and TSV conductors such as 451 to the topside of chip 412, and then through conductors passing through vias on the topside of the substrate 416 and routed along metal layers to the device feature on the chip 412.

Below-adjacent chip 414 is mechanically attached to the chip 412 by any of a variety of mechanisms, such as by dielectric adhesive, or by a separate scaffolding structure, or even by the mechanical and adhesive properties of the bump contacts 470. Other mechanisms will be apparent to the reader.

The TSV conductor 450 is not connected to any (insulated from all) conductors and device features on the below-adjacent chip 414. Preferably but not essentially, this is accomplished by not connecting the backside end of TSV conductor 450 to any RDL conductive segment (insulating the backside end of TSV conductor 450 from all RDL conductive segments). In the embodiment of FIG. 4, connection to any RDL conductive segment is avoided by not completely filling the via 460 with the conductive material 466. The remaining depth of via 460 may be filled with a dielectric, or with passivation material, or air. In other embodiments the conductive material 466 may fill via 460, in the same way as does the conductive material in via 462, but any RDL material is simply etched in such a pattern that avoids the lateral position of TSV 460. Many other mechanisms will be apparent to the reader for insulating TSV conductor 450 from any device feature on the below-adjacent chip 414.

FIG. 5 (consisting of FIGS. 5A through 5I) illustrates an example process flow that can be used to fabricate a 3D integrated circuit such as 410. It will be understood that many of the steps can be combined, performed partially or completely simultaneously with other steps, or performed in a different sequence without deviating from the invention. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the fabrication flow described herein mentions only steps that are pertinent to an understanding of the invention, and it will be understood that numerous additional fabrication steps, well known to the reader, may be needed to develop a working device.

Referring to FIG. 5A, initially, a lightly doped P-type wafer including substrate 416 is provided. This wafer may be, for example, on the order of 500 microns thick. Wafers typically are manufactured with the light P-type doping throughout, and arrive that way to the chip maker. After devices and interconnects are formed on a wafer the wafer is usually sliced ("diced") into individual dies, or chips. As used herein, the terms wafer and substrate are similar except that whereas "wafer" refers to the entire slice provided to the fab, "substrate" need not. "Substrate" applies equally well to an entire wafer or to a chip cut from the wafer.

Figure 5B:
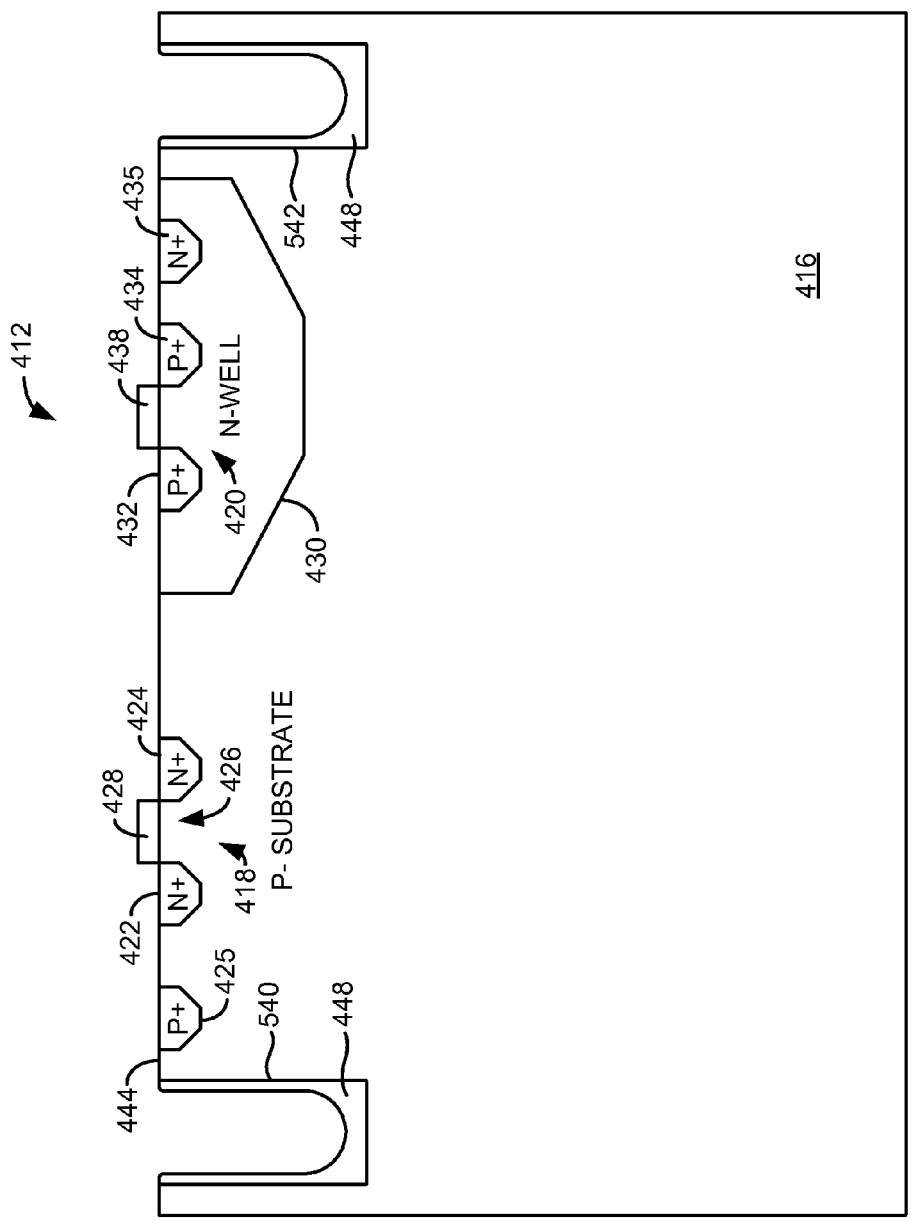
FIG. 5 (consisting of FIGS. 5A through 5I) illustrates an example process flow that can be used to fabricate a 3D integrated circuit such as that shown in FIG. 4.

Next, referring to FIG. 5B, N-well 430 is formed by known techniques such as ion implantation or dopant diffusion. Note that though the diffusion regions shown in the drawings are referred to herein as "diffusion" regions, it will be understood that this is only for convenience and that in many embodiments they may actually be formed by other methods such as ion implantation.

After the N-well 430 is formed, the gate stacks 428 and 438 are formed by known techniques. Known self-aligned techniques are then used to form the N+ diffusions 422 and 424 for NMOS transistor 418 and the P+ diffusions 432 and 434 for PMOS transistor 420. The contact pads 425 and 435 are also formed at this time. Next, trenches 540 and 542 are etched into the wafer, such as by forming and patterning a photoresist layer, and using the patterned photoresist as an etch mask for etching the trenches. The photoresist can then be removed by, for example, a plasma etch. The trenches 540 and 542 extend more than about 50 microns in depth, but do not pass through the entire substrate 416.

Next, the insulating material 448 is formed inside the trenches 540 and 542 and lining the walls thereof. For example, SiO2 or another dielectric can be grown or deposited over the trench sidewalls. Other insulating materials can be used as well, as can a combination of materials which together act as an insulator or dielectric.

Figure 5C:
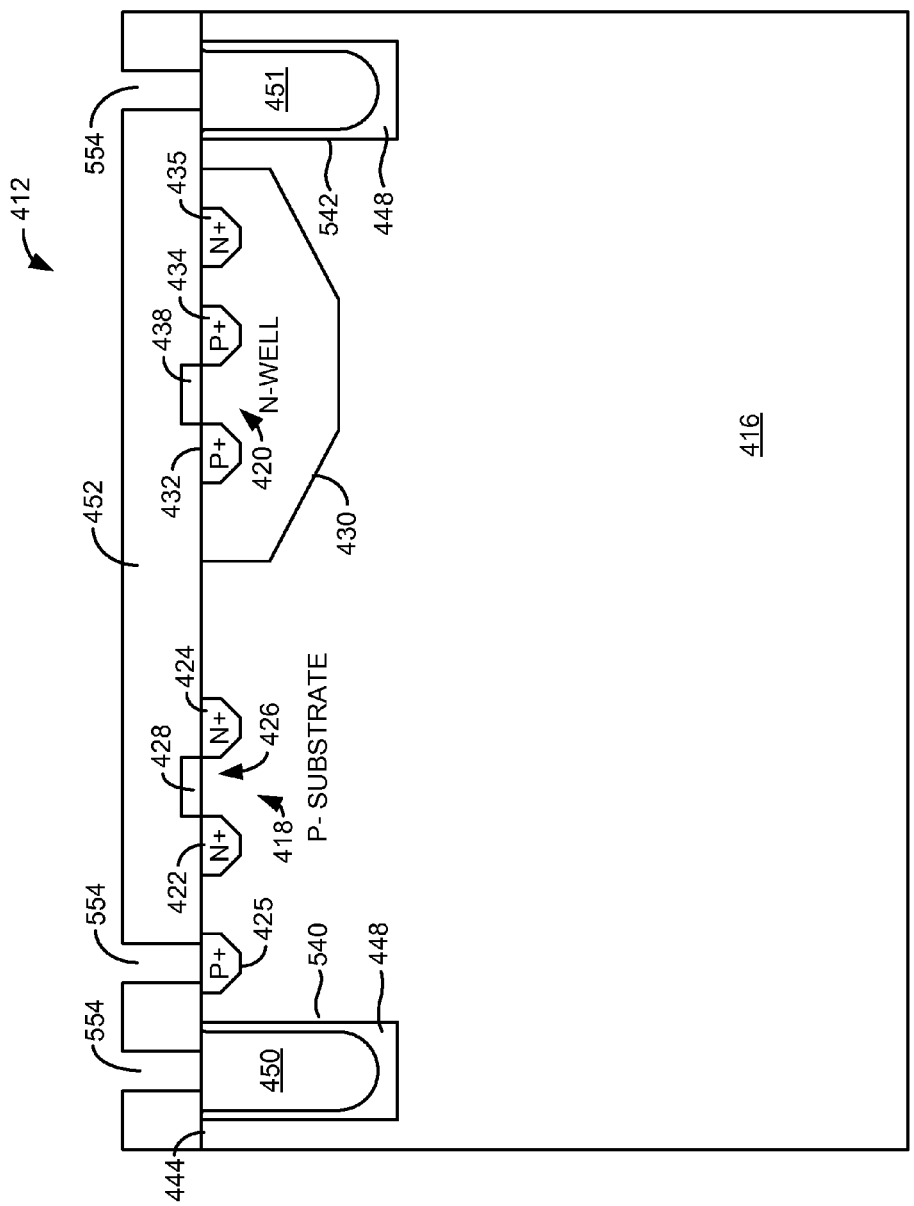

Referring to FIG. 5C, the TSV trenches 540 and 542 are filled with a conductive material such as copper, to form TSV conductors 450 and 451. This step can be accomplished for example by depositing a thin film seed metal layer on the inside surfaces of the trench sidewall material, and applying the conductive material by electroplating. Next, oxide layer 452 is formed by oxidation and vias such as 554 are etched in the oxide by applying and patterning a photoresist, then etching the oxide through exposed regions of the photoresist.

Figure 5D:
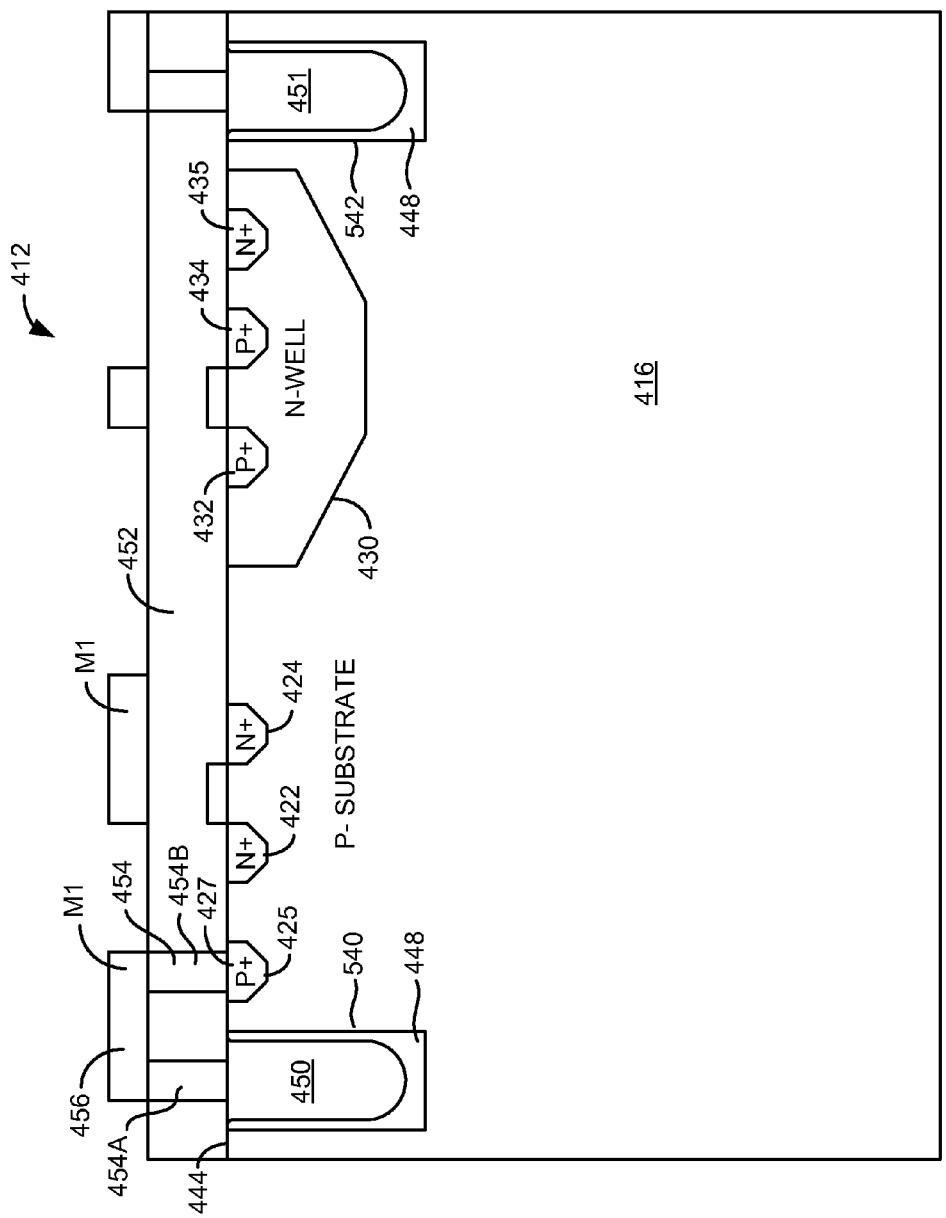

Referring to FIG. 5D, the vias 554 are then filled for example with aluminum, to thereby form conductors 454A, 454B, as well as other conductors 454. The M1 metal layer is then applied above the dielectric layer 452 and patterned to form metal interconnects including conductive segment 456. Conductive segment 456 completes the connection of the topside end of TSV conductor 450 to the topside surface of the substrate 416 at the contact pad 425. Other dielectric and conductive layers (not shown) are formed above the M1 layer.

Referring to FIG. 5E, after all the topside processing is complete, the wafer is ground from the backside until its thickness is reduced sufficiently to expose the backside ends of TSV conductors 450 and 451. The wafer is then inverted and backside processing begins. Referring to FIG. 5F, a dielectric layer such as oxide 458 is grown on the entire backside surface 446 of the substrate 416. Referring to FIG. 5G, vias 460 and 460 are formed in the oxide 458 by etching the oxide through a patterned photoresist. The via 462 is much narrower than the diameter of TSV 542, and is roughly centered laterally across the backside end of TSV conductor 451. The via 460, on the other hand, is either wider or laterally offset from the center of the backside end of TSV 540, or both, so that it exposes both the backside end of TSV conductor 450 and the region 467 on the backside surface 446 of the substrate 416. If desired to improve the connectivity to the substrate 416 backside surface, at this time an additional P+ contact pad (not shown) can be formed in the substrate 416 at region 467 by ion implantation through the backside vias. As used herein, an insulator such as 458 is said to have an opening "exposing" a region even though the opening might be filled with another material, such as a conductor. The term does not necessarily mean that the "exposed" region is visible through the opening. The term indicates that the "exposed" region is exposed at least so far as the insulator is concerned.

Figure 5I:
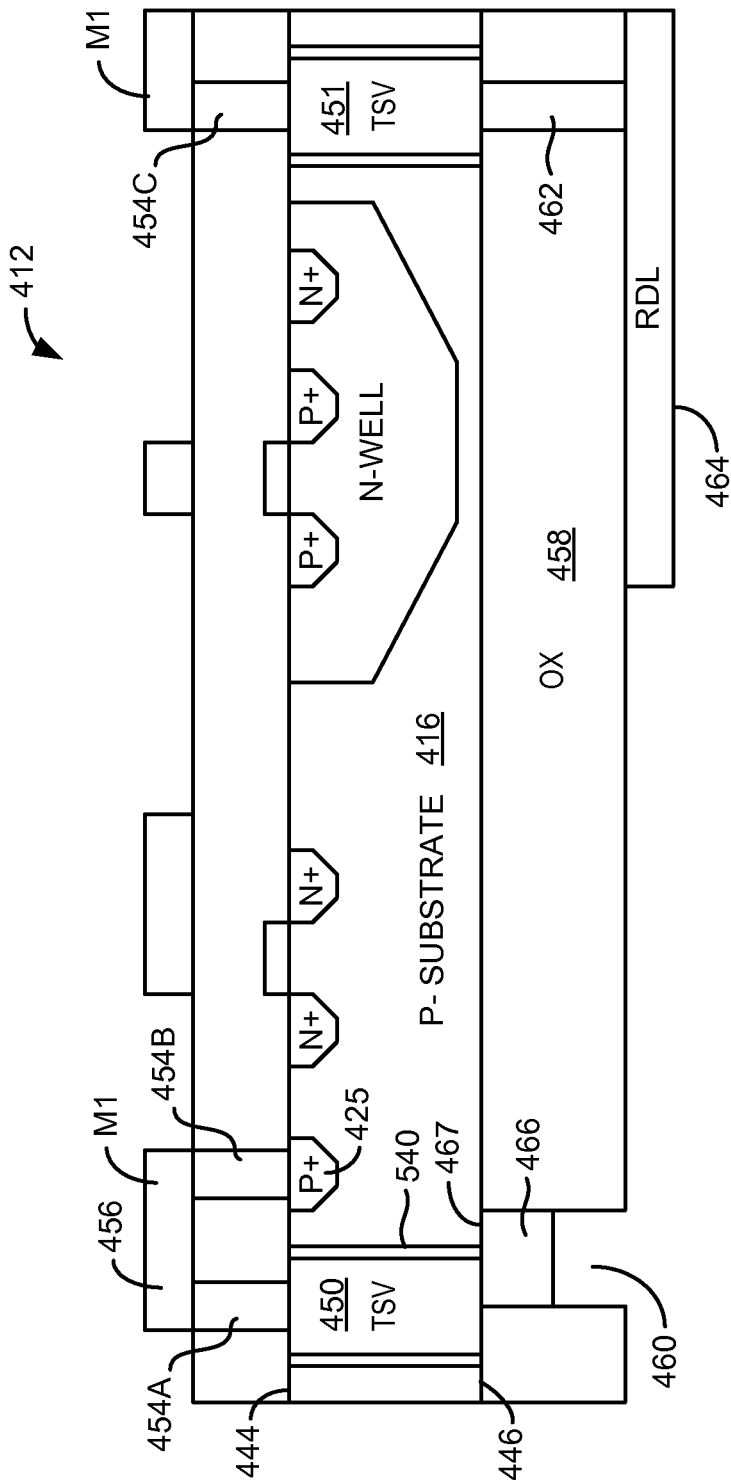

Referring to FIG. 5H, a metal layer is applied to the backside of the dielectric layer 458, which also fills the vias 460 and 462. This metal may be the same as that used to fill the TSVs 540 and 542. The metal 466 in via 460 connects to both the backside end of TSV conductor 450 and the region 467 on the backside surface 446 of the substrate 416. A conductive path is thereby completed from the contact pad 425 on the topside surface 444 of the substrate 416, through the TSV conductor 450, to the backside surface 446 of the substrate 416. The metal layer is then etched back so that it only partially fills via 460, as shown in the figure. A patterned photoresist mask is used to protect the metal in via 462 from this etch-back. An additional dielectric or passivation layer (not shown) is then formed in the via 460 to protect the metal 466 and to insulate it from contact with any other conductor on the chip 412 or on the below-adjacent chip 414. Referring to FIG. 5I, a metallization layer is then formed on the backside of dielectric layer 458 and patterned to form the RDL conductors 464. The metal used for the RDL conductors again may be the same as that used to fill the TSVs 540 and 542. As shown in FIG. 4I the RDL conductors connect to TSV conductor 451 (through via 462) but do not connect to (remain insulated from) TSV conductor 450. Additional RDL levels (not shown) may also be formed on the backside of the substrate 416 in various embodiments. The below-adjacent chip 414 is then attached as illustrated in FIG. 4.

Note that alternative embodiments exist in which some or all of the chips in a three-dimensional chip stack do not use RDL conductors at all. Such embodiments can still include TSV conductors like 450 solely for the purpose of the back-tie to the substrate 416 backside as described herein.

Overall Design Process Flow

Figure 6:
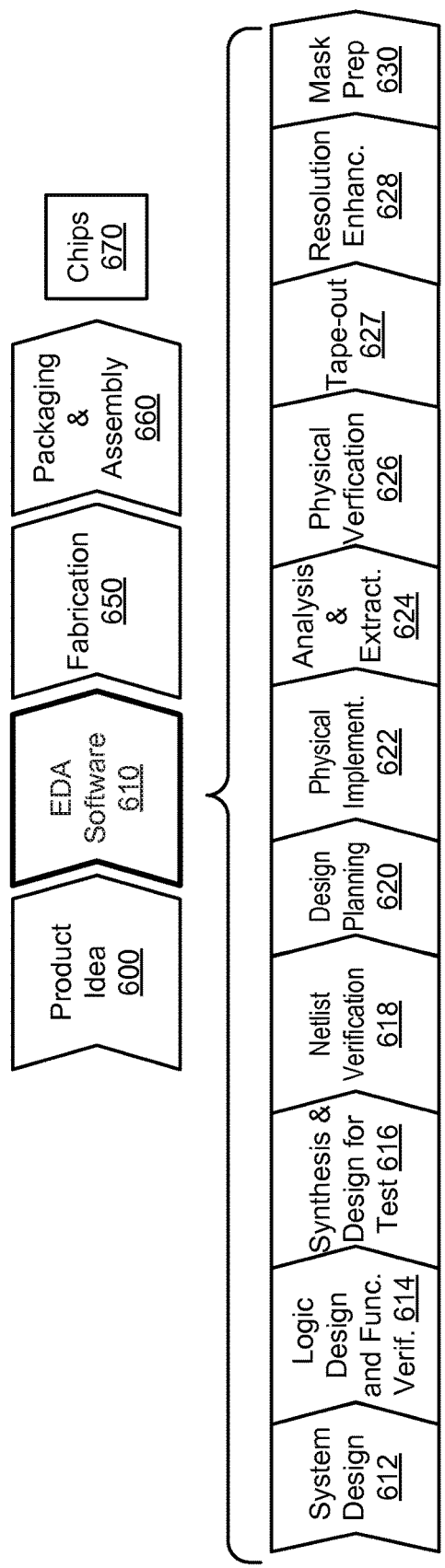
FIG. 6 shows a simplified representation of an illustrative digital integrated circuit design flow incorporating features of the invention.

FIG. 6 shows a simplified representation of an illustrative digital integrated circuit design flow, applicable for each of the chips 412 and 414 in the 3DIC. At a high level, the process starts with the product idea (step 600) and is realized in an EDA (Electronic Design Automation) software design process (step 610). When the design is finalized, it can be taped-out (step 627). At some point after tape out, the fabrication process (step 650) and packaging and assembly processes (step 660) occur resulting, ultimately, in finished integrated circuit chips (result 670).

The EDA software design process (step 610) is itself composed of a number of steps 612-630, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 610) will now be provided.

System design (step 612): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 614): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 616): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products.

Netlist verification (step 618): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 620): Here, an overall floor plan for the chip is constructed and analyzed for timing and top-level routing. Example EDA software products from Synopsys, Inc. that can be used at this step include Astro and Custom Designer products.

Physical implementation (step 622): The placement (positioning of circuit elements) and routing (connection of the same) occurs at this step, as can selection of library cells to perform specified logic functions. Example EDA software products from Synopsys, Inc. that can be used at this step include the Astro, IC Compiler, and Custom Designer products. The TSVs such as 450 can be defined in this step or in step 620 in various embodiments.

Analysis and extraction (step 624): At this step, the circuit function is verified at a transistor level, this in turn permits what-if refinement. Example EDA software products from Synopsys, Inc. that can be used at this step include Astro-Rail, PrimeRail, PrimeTime, and Star-RCXT products.

Physical verification (step 626): At this step various checking functions are performed to ensure correctness for: manufacturing, electrical issues, lithographic issues, and circuitry. Example EDA software products from Synopsys, Inc. that can be used at this step include the Hercules product.

Tape-out (step 627): This step provides the "tape-out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 628): This step involves geometric manipulations of the layout to improve manufacturability of the design. Example EDA software products from Synopsys, Inc. that can be used at this step include Proteus, ProteusAF, and PSMGen products.

Mask data preparation (step 630): This step provides mask-making-ready "tape-out" data for production of masks for lithographic use to produce finished chips. Example EDA software products from Synopsys, Inc. that can be used at this step include the CATS(R) family of products.

In the layout process performed in steps 620 and 622, the locations of all the TSVs typically are defined before other cells are placed. TSVs 540 in one embodiment are placed in a regular pattern across the chip. In another embodiment, TSVs 540 are placed close to the N+ and P+ regions of I/O areas, rather than those of core areas. In either case the placement may be performed automatically by a computer system under the control of place-and-route software.

The layout defines a number of masks for the fabrication process. Among these masks is a TSV layer mask, which identifies the lateral size, shape and position of each of the TSVs. This mask is used to pattern a photoresist on the substrate topside surface, with openings through which the TSV trenches will be etched. The layout also defines several metal layer masks, each used to pattern a respective one of the metal interconnect layers. It is in the layout for one of these masks that an interconnect is defined for electrically connecting the topside end of TSV conductor 450 to the heavily doped P+ contact pad 425. The layout also defines a mask to pattern the vias 460 and 462 in the backside dielectric 458. It is in the layout for this mask that the via 460 is defined such that it is either wider or laterally offset from the center of the backside end of TSV 540, or both, so that it exposes both the backside end of TSV conductor 450 and the region 467 on the backside surface 446 of the substrate 416. The layout also defines a mask to pattern a photoresist for etching back the metal 446 deposited in via 460 while protecting the metal in via 462 from this etchback.

Thus among other things, the layout identifies mask features (e.g. the locations of the photoresist openings) for etching a TSV 540 which, after electroplating and thinning, will form a TSV conductor 450 extending entirely through the chip. It also identifies mask features (e.g. the location of interconnect 456) for forming a conductive path electrically connecting the topside end of the TSV conductor 450 to P+ contact pad 425 on topside surface of the chip, as well as mask features (e.g. the size, shape and position of via 460 in the backside dielectric 458) for electrically interconnecting the backside end of the TSV conductor 450 to region 467 on the backside surface 446 of the chip. The layout of course also defines many other masks for fabrication of the chip 412.

Computer System

Figure 7:
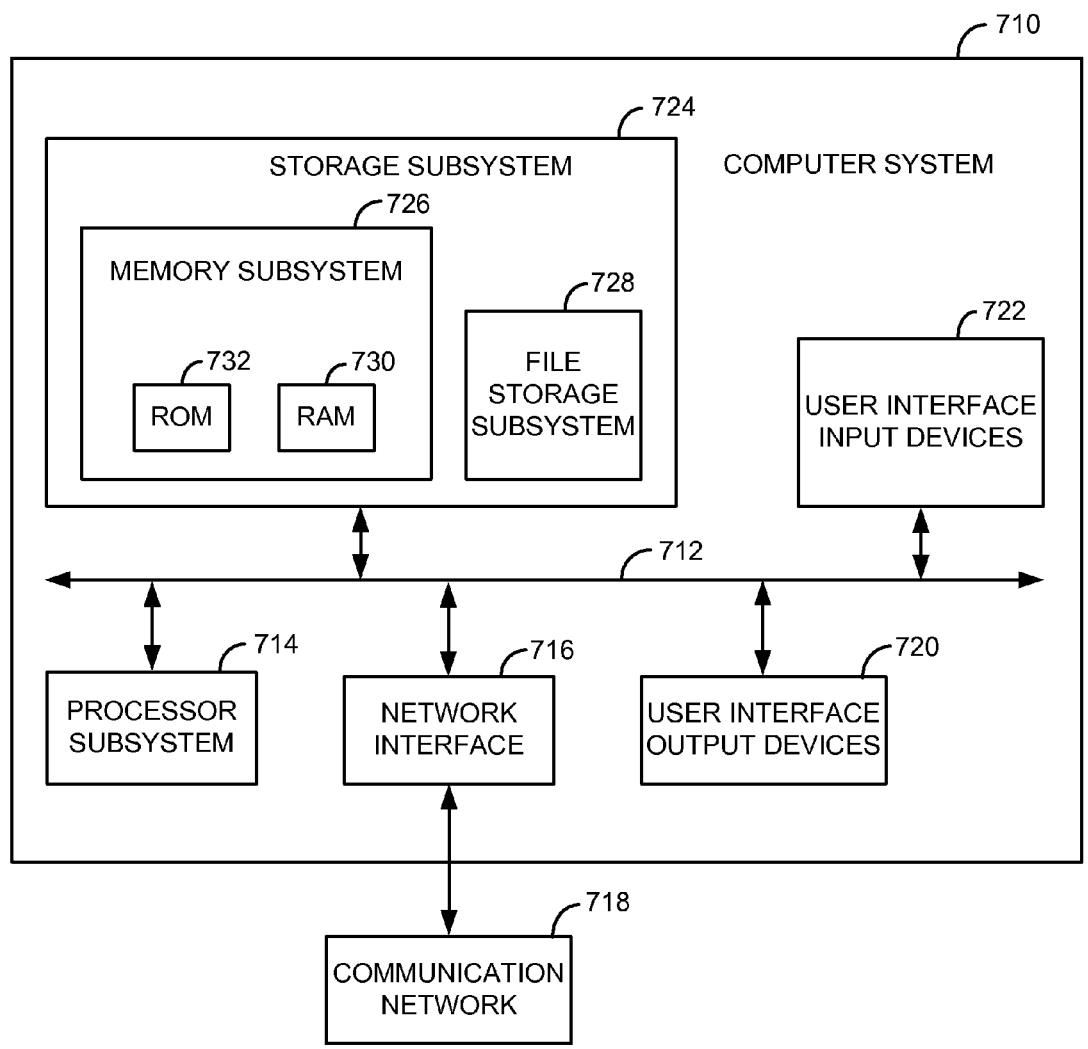
FIG. 7 is a simplified block diagram of a computer system 710 that can be used to implement software incorporating aspects of the present invention.

FIG. 7 is a simplified block diagram of a computer system 710 that can be used to implement software incorporating aspects of the present invention. In particular, the layout process described above is implemented using such a computer system, under control of layout software. The software implementing the layout process and the other process steps identified in FIG. 6 causes the computer system 710 to operate in the specified manner.

Computer system 710 typically includes a processor subsystem 714 which communicates with a number of peripheral devices via bus subsystem 712. These peripheral devices may include a storage subsystem 724, comprising a memory subsystem 726 and a file storage subsystem 728, user interface input devices 722, user interface output devices 720, and a network interface subsystem 716. The input and output devices allow user interaction with computer system 710. Network interface subsystem 716 provides an interface to outside networks, including an interface to communication network 718, and is coupled via communication network 718 to corresponding interface devices in other computer systems. Communication network 718 may comprise many interconnected computer systems and communication links. These communication links may be wireline links, optical links, wireless links, or any other mechanisms for communication of information, but typically it is an IP-based communication network. While in one embodiment, communication network 718 is the Internet, in other embodiments, communication network 718 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 722 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 710 or onto computer network 718.

User interface output devices 720 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 710 to the user or to another machine or computer system.

Storage subsystem 724 stores the basic programming and data constructs that provide the functionality of certain embodiments of the present invention. For example, the various modules implementing the functionality of certain embodiments of the invention may be stored in storage subsystem 724. These software modules are generally executed by processor subsystem 714.

Memory subsystem 726 typically includes a number of memories including a main random access memory (RAM) 730 for storage of instructions and data during program execution and a read only memory (ROM) 732 in which fixed instructions are stored. File storage subsystem 728 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 728. The host memory 726 contains, among other things, computer instructions which, when executed by the processor subsystem 714, cause the computer system to operate or perform functions as described herein. As used herein, processes and software that are said to run in or on "the host" or "the computer", execute on the processor subsystem 714 in response to computer instructions and data in the host memory subsystem 726 including any other local or remote storage for such instructions and data.

Bus subsystem 712 provides a mechanism for letting the various components and subsystems of computer system 710 communicate with each other as intended. Although bus subsystem 712 is shown schematically as a single bus, alternative embodiments of the bus subsystem may use multiple busses.

Computer system 710 itself can be of varying types including a personal computer, a portable computer, a workstation, a computer terminal, a network computer, a television, a mainframe, a server farm, or any other data processing system or user device. Due to the ever changing nature of computers and networks, the description of computer system 710 depicted in FIG. 7 is intended only as a specific example for purposes of illustrating the preferred embodiments of the present invention. Many other configurations of computer system 710 are possible having more or less components than the computer system depicted in FIG. 7.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The following references are incorporated herein for their teachings: U.S. Patent Pre-grant Publication Nos. 2010-0244179 and 2011-0195546, and U.S. Pat. Nos. 5,428,247, 7,262,109, 7,691,748 and 7,956,442.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, whereas "TSV early" processing is described above with respect to FIG. 5, other embodiments can use other variants such as "TSV first" processing. Also, in some embodiments, the contact to the backside surface can be connected for example to the ground of the below-adjacent chip through an RDL routing conductor. In particular, and without limitation, any and all variations described, suggested or incorporated by reference in this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method for designing an integrated circuit device, comprising:
    using a computer system, providing a simulation model for a three-dimensional integrated circuit device implementing an integrated circuit design,
        the device having a first chip superposing a second chip, the first chip having a first substrate having opposite topside and backside surfaces and the second chip having opposite topside and backside surfaces, the first chip having an insulating layer on the backside surface of the first substrate,
        wherein first and second TSVs each extend entirely through the first substrate,
        wherein a conductive path electrically connects the first TSV on a first end to the first substrate topside surface, and on a second end to the first substrate backside surface, thereby suppressing latch-up in the first chip, the second end of the first TSV being electrically insulated from the second chip, and
        wherein the second TSV electrically connects through a via in the insulating layer on the backside surface of the first substrate to an electrically conductive feature on the topside surface of the second chip; and
    generating tape-out data in response to the simulation model for use in production of mask-making-ready tape-out data for use to produce masks and finished chips.

2. The method of claim 1 further comprising generating tape-out data for production of lithographic masks.

3. The method of claim 1 wherein an opening in the insulating layer on the backside surface of the first substrate exposes both the second end of the first TSV and a particular region of the first substrate on the backside surface thereof.

4. The method of claim 3 wherein conductive material in the opening electrically connects the second end of the first TSV with the particular region.

5. The method of claim 1 wherein a plurality of RDL connectors are disposed on the backside of the insulating layer, at least one of the RDL connectors electrically connected to both to the second TSV through the via in the insulating layer, and to the electrically conductive feature on the topside surface of the second chip.

6. An electronic design automation (EDA) system having a processor and a non-transitory computer-readable storage medium that stores software code portions for modeling a three-dimensional integrated circuit device having a first chip superposing a second chip, the first and second chips each having opposite topside and backside surfaces, wherein the software code portions, when executed by a processor, build a software model, the software model:
    a) defining placement and routing for at least one metal layer on the topside of the first chip, and
    b) defining placement and routing for at least one metal layer on the topside of the second chip, and
    c) identifying a position of each of a plurality of TSVs, each TSV extending entirely through the first chip,
    wherein, in the software model:
        a transistor is formed in the first chip,
        a first conductive path electrically connects a first TSV of the plurality on a first end to the first chip topside surface at a first point, and on a second end to the first chip backside surface, thereby suppressing latch-up, the second end of the first TSV being electrically insulated from the second chip, and
        a second TSV of the plurality forms part of a second conductive path between the at least one metal layer on the topside surface of the first chip and the at least one metal layer on the topside surface of the second chip,
    and wherein the software code portions generate tape-out data in response to the software model, for use in production of mask-making ready tape-out data for use to produce masks and finished chips.

7. The system of claim 6 wherein, in the software model, the first conductive path further comprises a conductive material filling a via through an insulating layer on the backside of the first chip.

8. The system of claim 7 wherein the second conductive path further includes one of a plurality of RDL connectors disposed on the backside of the insulating layer.

9. The system of claim 6 wherein, in the software model, the first chip comprises a p-type lightly doped substrate, and wherein the first point is on a p-type heavily doped contact pad on the first chip topside surface.

10. The system of claim 6, wherein the storage medium further stores software code portions which, when executed by a processor, simulate an aspect of the three-dimensional integrated circuit device.

11. An electronic design automation (EDA) system having a processor and a non-transitory computer-readable storage medium storing first software code portions and second software code portions,
    wherein the first software code portions, when executed by a processor, plan layout of a three-dimensional integrated circuit device implementing an integrated circuit design, the device having a first chip superposing a second chip, the first and second chips each having opposite topside and backside surfaces, the layout identifying:
        a) at least one metal layer on the topside surface of the first chip,
        b) at least one metal layer on the topside surface of the second chip, and c) a plurality of TSVs, each TSV extending entirely through the first chip;

wherein the second software code portions, when executed by a processor, generate a tape-out data file to define a plurality of masks, the plurality of masks comprising:
  a) a first mask used to form the at least one metal layer on the topside of the first chip,
  b) a second mask used to form the at least one metal layer on the topside of the second chip,
  c) at least one TSV mask identifying a position of each of the plurality of TSVs, and
  d) at least one mask used to form a transistor is in the first chip, wherein a first conductive path electrically connects a first TSV of the plurality on a first end to the first chip topside surface, and on a second end to the first chip backside surface, thereby suppressing latch-up in the first chip, the second end of the first TSV being electrically insulated from the second chip, and wherein a second TSV of the plurality forms part of a second conductive path between the at least one metal layer on the topside surface of the first chip and the at least one metal layer on the topside surface of the second chip, wherein the tape-out data file is used in production of mask-making-ready tape-out data for use to produce masks and finished chips.

12. The system of claim 11 wherein, in the integrated circuit design, the first conductive path further comprises a conductive material filling a via formed in an insulating layer on the backside of the first chip.

13. The system of claim 12 wherein the second conductive path further comprises one of a plurality of RDL connectors disposed on the backside of the insulating layer.

14. The system of claim 13 wherein the second conductive path further comprises a bump contact disposed between the at least one of the plurality of RDL connectors and the metal layer on the topside surface of the second chip.

15. The system of claim 11, wherein the storage medium further stores third software code portions which, when executed by a processor, simulate an aspect of the three-dimensional integrated circuit device.

* * * * *